United States Patent
Yu et al.

(10) Patent No.: US 7,781,799 B2
(45) Date of Patent: Aug. 24, 2010

(54) SOURCE/DRAIN STRAINED LAYERS (75) Inventors: Ming-Hua Yu, Jhubei (TW); Ling-Yen Yeh, Hsin-Chu (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 313 days.

(21) Appl. No.: 11/923,420

(22) Filed: Oct. 24, 2007

(65) Prior Publication Data

US 2009/0108290 A1 Apr. 30, 2009

(51) Int. Cl.
*H01L 31/0328* (2006.01)

(52) U.S. Cl. .................... 257/190; 257/18; 257/629; 257/369; 257/408; 257/E29.193

(58) Field of Classification Search ............ 257/190, 257/18, 629, 369, 408, E29.193
See application file for complete search history.

(56) References Cited

U.S. PATENT DOCUMENTS

| | | | |
|---|---|---|---|
| 4,728,619 A | 3/1988 | Pfiester et al. | |
| 5,006,477 A * | 4/1991 | Farb | 438/231 |
| 6,051,458 A | 4/2000 | Liang et al. | |
| 6,649,538 B1 | 11/2003 | Cheng et al. | |
| 6,703,271 B2 | 3/2004 | Yeo et al. | |
| 6,806,151 B2 | 10/2004 | Wasshuber et al. | |
| 6,921,913 B2 | 7/2005 | Yeo et al. | |
| 7,118,952 B2 | 10/2006 | Chen et al. | |
| 7,166,528 B2 | 1/2007 | Kim et al. | |
| 7,202,142 B2 | 4/2007 | Lee et al. | |
| 2004/0087075 A1 | 5/2004 | Wang et al. | |
| 2004/0115878 A1 | 6/2004 | Lee et al. | |
| 2004/0157399 A1 | 8/2004 | Lee et al. | |
| 2005/0035409 A1 | 2/2005 | Ko et al. | |
| 2005/0093021 A1 | 5/2005 | Ouyang et al. | |
| 2006/0186470 A1 * | 8/2006 | Chen et al. | 257/344 |
| 2006/0189053 A1 | 8/2006 | Wang et al. | |
| 2006/0267106 A1 | 11/2006 | Chao et al. | |
| 2007/0057287 A1 * | 3/2007 | Lin et al. | 257/190 |
| 2007/0132038 A1 * | 6/2007 | Chong et al. | 257/401 |

(Continued)

FOREIGN PATENT DOCUMENTS

CN 1761072 A 4/2006

(Continued)

OTHER PUBLICATIONS

Bedell, S.W., et al., "300 mm SGOI/Strained-Si for High-Performance CMOS," 2004 Semiconductor Equipment and Materials International, Semicon West, 6 pages.

(Continued)

*Primary Examiner*—Tu-Tu V Ho
(74) *Attorney, Agent, or Firm*—Slater & Matsil, L.L.P.

(57) ABSTRACT

A semiconductor device and method of manufacture thereof wherein a PMOS source/drain region of a transistor within the substrate includes a first strained layer in the PMOS source/drain region and a first capping layer in contact with the first strained layer. Further, the semiconductor device and method provide for an NMOS source/drain region of a transistor within the substrate including a second strained layer in the NMOS source/drain region and a second capping layer in contact with the second strained layer.

12 Claims, 7 Drawing Sheets

U.S. PATENT DOCUMENTS

2007/0138570 A1* 6/2007 Chong et al. ............... 257/371
2008/0102571 A1* 5/2008 Pan ........................... 438/197

FOREIGN PATENT DOCUMENTS

JP         2005-72056         3/2005

OTHER PUBLICATIONS

Chidambaram, P.R., et al., "35% Drive Current Improvement from Recessed-SiGe Drain Extensions on 37 nm Gate Length PMOS," 2004 Symposium on VLSI Technology Digest of Technical Papers (2004) pp. 48-49.

Ghani, T., et al., "A 90nm High Volume Manufacturing Logic Technology Featuring Novel 45nm Gate Length Strained Silicon CMOS Transistors," IEDM (2003) pp. 978-980.

Lee, B.H., et al., "Performance Enhancement on Sub-70nm Strained Silicon SOI MOSFETs on Ultra-thin Thermally Mixed Strained Silicon/SiGe on Insulator (TM-SGOI) Substrate with Raised S/D," IEDM (2002) pp. 946-948.

Mizuno, T., et al., "High-Performance Strained-SOI CMOS Devices Using Thin Film SiGe-on-Insulator Technology," IEEE Transactions on Electron Devices, vol. 50, No. 4 (Apr. 2003) pp. 988-994.

Shimizu, A., et al., "Local Mechanical-Stress Control (LMC): A New Technique for CMOS-Performance Enhancement," International Electron Devices Meeting (2001) pp. 433-436.

Tezuka, T., et al., "A Novel Fabrication Technique of Ultrathin and Relaxed SiGe Buffer Layers with High Ge Fraction for Sub-100 nm Strained Silicon-on-Insulator MOSFETs," Jpn. J. Appl. Phys., vol. 40 (Apr. 2001) pp. 2866-2874.

* cited by examiner

SOURCE/DRAIN STRAINED LAYERS

TECHNICAL FIELD

The present invention relates generally to the manufacturing of semiconductor devices, and more particularly to a device, structure, and method for improving performance of a metal oxide semiconductor field effect transistor (MOSFET).

BACKGROUND

Classical semiconductor scaling, typically known as a device shrink, is currently supplemented by effective scaling using techniques such as stress memorization. Stress memorization techniques are being used to speed carrier mobility in transistor channels, enabling higher drive currents. Stress or strain in a device may have components in three directions, parallel to the metal-oxide-semiconductor (MOS) device channel length, parallel to the device channel width, and perpendicular to the channel plane. The strains parallel to the device channel length and width are called in-plane strains. Research has revealed that a bi-axial, in-plane tensile strain field can improve NMOS (N-channel MOS transistor) performance, and compressive strain parallel to channel length direction can improve PMOS (P-channel MOS transistor) device performance.

One way to develop strain is by using a graded SiGe epitaxy layer as a substrate on which a layer of relaxed SiGe is formed. A layer of silicon is formed on the relaxed SiGe layer. MOS devices are then formed on the silicon layer, which has inherent strain. Since the lattice constant of SiGe is larger than that of Si, the Si film is under biaxial tension and thus the carriers exhibit strain-enhanced mobility. The lattice spacing mismatch between the SiGe layer causes the underlying layer to develop an in-plane stress to match the lattice spacing. However, with entire underlying layers under stress, defects causing junction leakage may be more prevalent.

Strain can also be applied by forming a strained barrier layer, such as a nitride layer, on a MOS device. However, the barrier layer may not produce sufficient stress to produce the desired results. The conventional method of forming strained barrier layers suffers drawbacks, and the effect is limited by the properties of the barrier layer. For example, the thickness of the strained barrier layer is limited due to the subsequent gap filling difficulty caused by the thick barrier layer. Therefore, the strain applied by the barrier layer is limited. In addition, forming a strained barrier layer that has customized strains for different devices, such as PMOS and NMOS devices, is particularly complex and costly.

Figure 1:
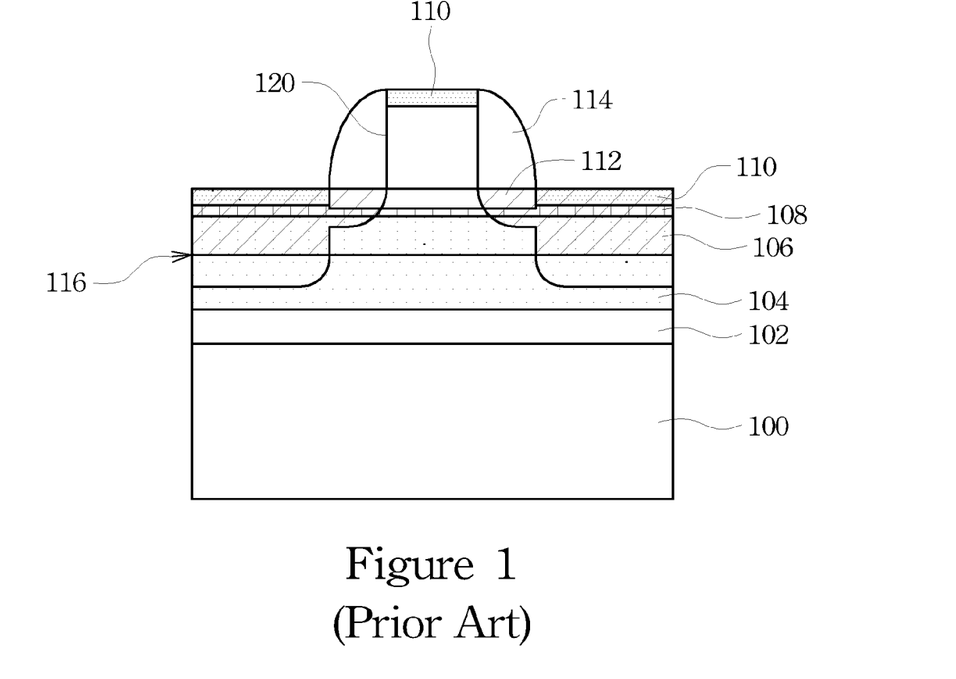
FIG. 1 is a cross-sectional view of a prior art source/drain structure.

Turning to FIG. 1, a method of forming a tensile strained silicon channel is illustrated. A buffered Si layer 102 is epitaxially grown on semiconductor substrate 100. A step graded SiGe layer 104 is epitaxially grown between the buffered Si layer 102 and a relaxed SiGe layer 106. A strained Si layer 108 is epitaxially grown on the relaxed SiGe layer 106. Gate dielectric 112 is formed on the strained Si layer 108. Further, source/drain regions 116 and gate electrode 120 have silicided areas 110.

Some disadvantages to this and other prior art methods may include poor device performance in advancing technologies, such as the 32 nm node. Among the poor device performance issues is poor junction leakage, severe SiGe loss, and relaxation of strained layers.

SUMMARY OF THE INVENTION

These and other problems are generally solved or circumvented, and technical advantages are generally achieved by implementing a bi-layer or tri-layer source/drain structure on semiconductor devices.

In accordance with an illustrative embodiment of the present invention, a semiconductor device, a structure, and method of manufacture is provided. A trench area is etched in a source/drain region of a transistor in a silicon substrate. A strained layer is deposited within the source/drain region, and a capping layer is adjacent to the strained layer.

A further illustrative embodiment further includes a lightly doped region between the substrate and the strained layer.

Advantages of illustrative embodiments of the present invention include improving device performance with respect to junction leakage, resistivity, gain, and the relaxation of the strained region.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention. The present invention will be described with respect to illustrative embodiments in a specific context, namely both N and P MOS transistors in the generic, low power, 32 nanometer technology node. The invention may also be applied, however, to other semiconductor devices and technologies.

Figure 2:
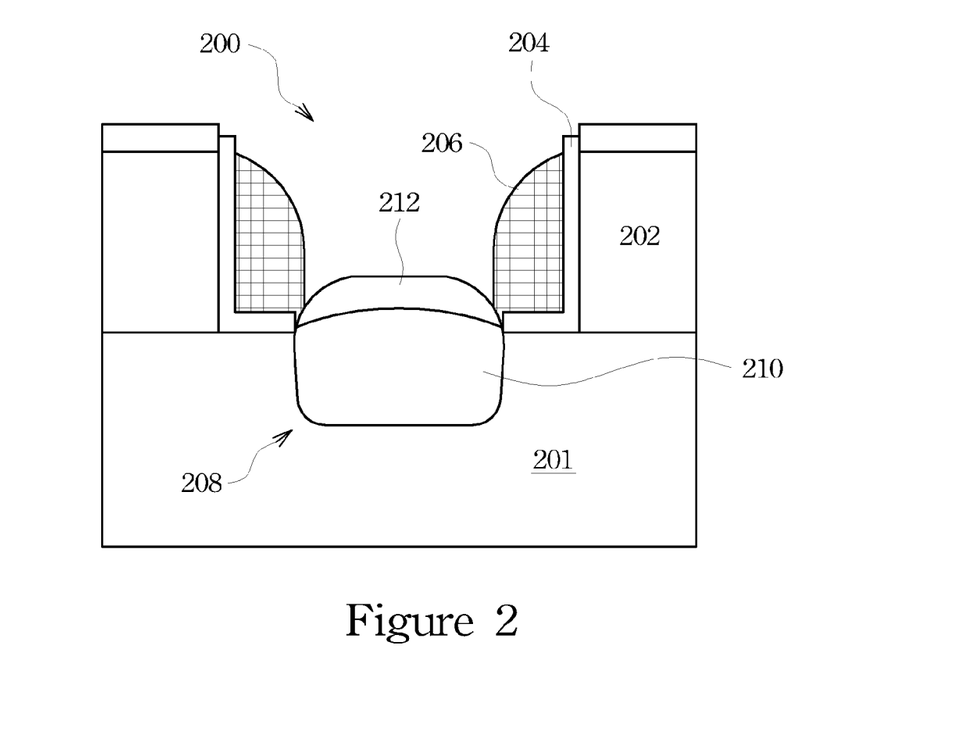
FIG. 2 is a cross-sectional view of an illustrative embodiment of a bi-layer shared source/drain structure.

With reference now to FIG. 2, there is shown an illustrative embodiment of a shared bi-layer source/drain structure in a CMOS device. Work piece 200 has included substrate 201, gate electrode 202 and sidewall spacer 206. Sidewall liner 204 may be interposed between gate electrode 202, and sidewall spacer 206. While the source/drain structure in FIG. 2 is shared, the scope of these embodiments includes non-shared source/drain regions. Work piece 200 may also include other active components, circuits, and the like, not shown. Substrate 201 may comprise silicon or other semiconductor material covered by an insulating layer, for example. Substrate 201 may comprise silicon oxide over single-crystal silicon, for example.

The source drain region 208 is comprised of main strained layer 210 disposed in an etched opening in substrate layer 201. Main strained layer 210 may be $Si_xGe_y$ (SiGe) or $Si_xC_y$ (SiC) for example. Further, main strained layer 210 may be moderately doped with N-type dopant for N-channel devices such as phosphorous and P-type dopant for P-channel devices such as boron. The moderate dopant levels may be, for example between $1\,E19\,cm^{-3}$-$1\,E20\,cm^{-3}$. The main strained layer 210 may consist of SiGe in the case of a PMOS transistor or silicon carbide (SiC) in the case of an NMOS transistor.

Capping layer 212 may be a Si layer, a boron doped Si (SiB) layer, a combination of the layers or the like for a PMOS transistor. Capping layer 212 may be a Si layer, a phosphorous doped Si (SiP) layer, a combination of the layers or the like for an NMOS transistor.

Figure 3:
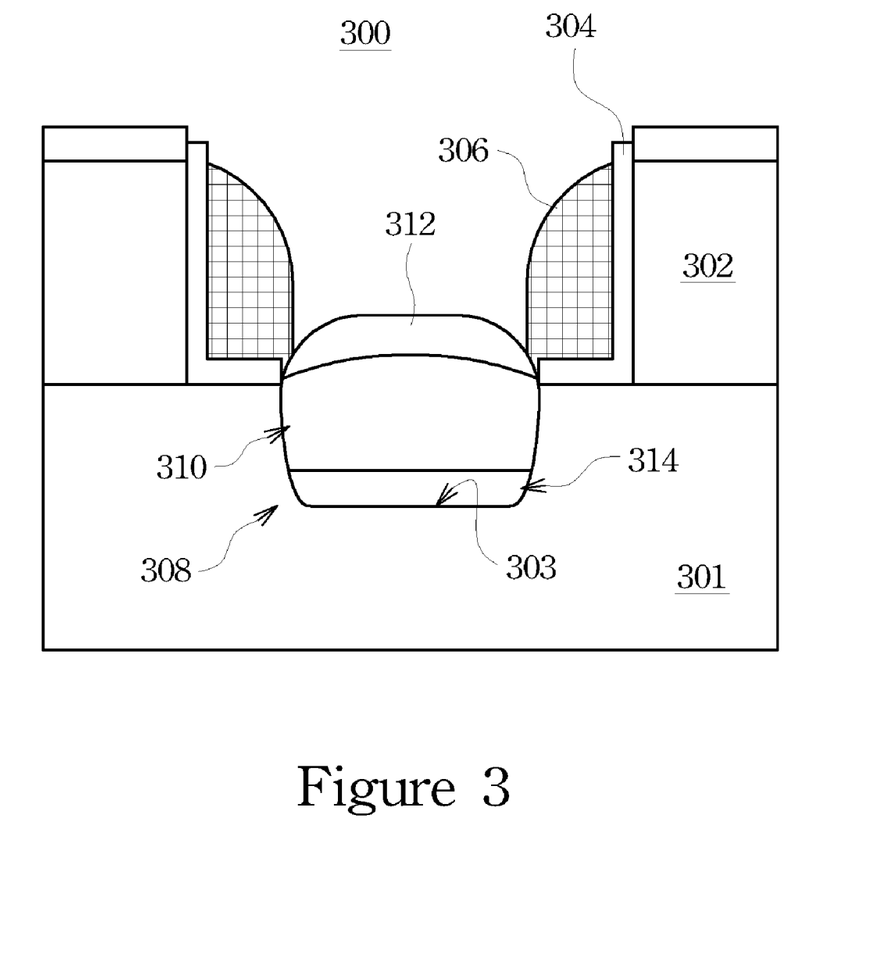
FIG. 3 is a cross-sectional view of a further illustrative embodiment of a tri-layer shared source/drain structure.

FIG. 3 is a cross-sectional view of another illustrative embodiment. While the source/drain structure in FIG. 3 is shared, the scope of these embodiments includes non-shared source/drain regions. Work piece 300 has included substrate 301, gate electrode 302 and sidewall spacer 306. Sidewall liner 304 may be interposed between gate electrode 302 and sidewall spacer 306. Work piece 300 may also include other active components, circuits, and the like, not shown. Substrate 301 may comprise silicon or other semiconductor material covered by an insulating layer. For example, substrate 301 may comprise silicon oxide over single-crystal silicon.

The source drain region 308 is comprised of main strained layer 310 disposed in an etched opening in substrate 301. Main strained layer 310 may be $Si_xGe_y$ (SiGe) or $Si_xC_y$ (SiC) for example. Further, main strained layer 310 may be moderately doped with N-type dopant for N-channel devices such as phosphorous and P-type dopant for P-channel devices such as boron. The moderate dopant levels may be, for example, between $1\,E19\,cm^{-3}$-$1\,E20\,cm^{-3}$. The main strained layer 310 may consist of SiGe in the case of a PMOS transistor or silicon carbide (SiC) in the case of an NMOS transistor.

Capping layer 312 may be a Si layer, a SiB layer, a combination of layers or the like for a PMOS transistor. Capping layer 312 may be a Si layer, a SiP, a combination of layers or the like for an NMOS transistor.

This embodiment provides a first strained layer 314 interposed between surface of the etched substrate 303 and main strained layer 310 of source/drain region 308. First strained layer 314 may or may not be a lightly doped layer of the same material as main strained layer 310. Lightly doped, in this context, means less than $1\,L19\,cm^{-3}$ of N-type dopant or P-type dopant. Main strained layer 310 is adjacent to first strained layer 314. Capping layer 312 is adjacent to main strained layer 310.

Figure 4:
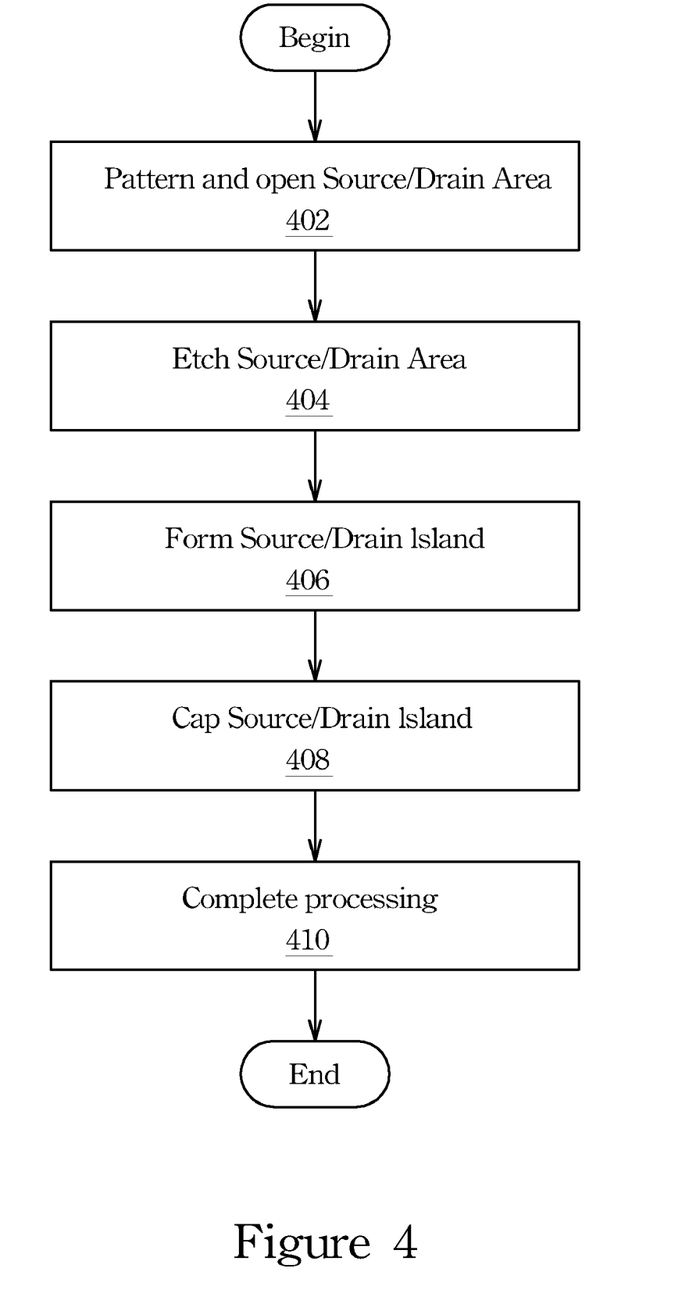
FIG. 4 is a flow chart illustrating the process steps for a method of manufacture of a bi-layer embodiment.

FIG. 4 is a process flow showing the steps in the formation of one illustrative embodiment. The process begins with a wafer processed through sidewall etch. The wafer is patterned with source/drain areas opened (step 402). A photoresist over the top surface of the work piece may be exposed using a mask having transparent regions and opaque regions, thereby patterning the photoresist to provide for open areas, free of photoresist, in the source/drain region. Alternatively, the substrate may be directly patterned using electron beam lithography EBL, or the like.

Following step 402, the source/drain region is etched (step 404). The source/drain region is etched by processing the work piece in a reactive ion etch plasma reactor, for example. The depth of the etch may be in the range of about 30 nm to 100 nm.

A source/drain island is formed in the etched source/drain region (step 406). The source/drain island may comprise a moderately doped main strained layer of SiGe, or SiC. The SiGe layer may be formed in a chemical vapor deposition (CVD) tool or a furnace using, for example, gases such as $SiH_2Cl_2$ or $SiH_4$, may be used as the Si source. Gas flows between about 10 sccm and 300 sccm may be used. $GeH_4$, may be used for the Ge content. Gas flows between about 50 sccm to 800 sccm may be used. An HCl gas may be used to reduce defects, at a gas flow of about 10 sccm to 300 sccm. The source/drain island may be formed in a process accomplished between about 500 to 800 C, with a pressure of between 1 to 700 Torr. Doping levels may be controlled during formation of the source/drain island or doping may be implanted in a separate process using an ion implanter and an anneal process.

The source/drain island is then capped (step 408). The capping layer may be comprised of Si, SiB, or SiP, or the like. The SiB may be formed using gases such as $SiCl_2H_2$ or $SiH_4$ with $B_2H_6$ for Boron doping in the Si layer. SiP forming gas may be formed using gases such as $SiCl_2H_2$ or $SiH_4$ with $PH_3$ for phosphorous doping. These layers may be implemented in a low pressure chemical vapor deposition (LPCVD) process. The capping layer may also be deposited in a process specifying steps implemented between about 500 C to 800 C, with a pressure at 1-700 Torr while using a forming gas. Following capping step 408, the process continues to completion (step 410).

For example, in the NMOS source/drain region, the first strained layer may comprise silicon carbide (SiC) with a phosphorous (P) doping. The capping layer may comprise a SiP layer. In the PMOS source/drain region, the first strained layer may comprise SiGe and the dopant may be boron (B) or other P-type dopant. The capping layer may comprise SiB layer.

Figure 5:
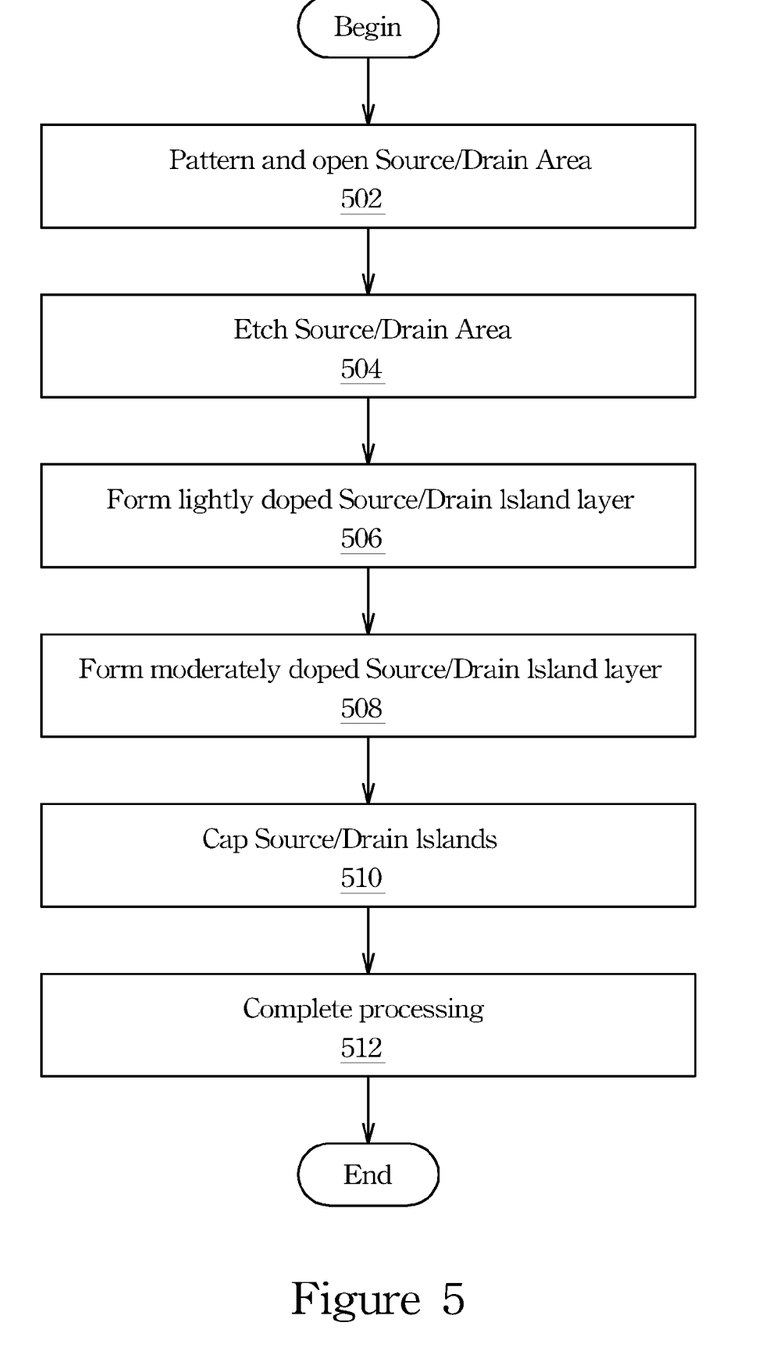
FIG. 5 is a flow chart illustrating the process steps for a method of manufacture of a tri-layer embodiment.

FIG. 5 is a process flow providing for a tri-layer process for a source/drain structure. The process begins with a wafer processed through sidewall etch. The wafer is patterned with source/drain areas opened (step 502). A photoresist over the top surface of the work piece may be exposed using a mask having transparent regions and opaque regions, thereby patterning the photoresist to provide for open areas, free of photoresist, in the source/drain region. Alternatively, the substrate may be directly patterned using electron beam lithography EBL, or the like.

Following step 502, the source/drain region is etched (step 504). The source/drain region is etched by processing the work piece in a reactive ion etch plasma reactor, for example. The depth of the etch may be in the range of about 30 nm to 100 nm. Following etch step 504, a lightly doped source/drain island layer is formed (step 506). The dopant levels are controlled by the gas mixture in the CVD process, or alternatively in a separate ion implantation step. Lightly doped may mean a doping level less than 1 E19 $cm^{-3}$. Doping for N-type source/drains is an N-type dopant such as phosphorous, arsenic, antimony or the like, and doping for P-type source/drains is a P-type dopant such as B or $BF_2$ or the like.

A moderately doped main strained layer is formed on the lightly doped source/drain island layer in the etched source/drain region (step 508). The source/drain island may comprise a moderately doped main strained layer of SiGe, or SiC. The SiGe layer may be formed in a chemical vapor deposition (CVD) tool or a furnace using, for example, gases such as $SiH_2Cl_2$ or $SiH_4$, may be used as the Si source. Gas flows between about 10 sccm and 300 sccm may be used. $GeH_4$, may be used for the Ge content. Gas flows between about 50 sccm to 800 sccm may be used. An HCl gas may be used to reduce defects, at a gas flow of about 10 sccm to 300 sccm. The source/drain island may be formed in a process accomplished between about 500 to 800 C, with a pressure of between 1 to 700 Torr. Doping levels may be controlled during formation of the source/drain island or doping may be implanted in a separate process using an ion implanter and an anneal process.

The source/drain island is then capped (step 510). The capping layer may be comprised of Si, SiB, or SiP, or the like. The SiB may be formed using gases such as $SiCl_2H_2$ or $SiH_4$ with $B_2H_6$ for Boron doping in the Si layer. SiP forming gas may be formed using gases such as $SiCl_2H_2$ or $SiH_4$ with $PH_3$ for phosphorous doping. These layers may be implemented in a low pressure chemical vapor deposition (LPCVD) process. The capping layer may also be deposited in a process specifying steps implemented between about 500 C to 800 C, with a pressure at 1-700 Torr while using a forming gas. Following the capping step (510), the process continues with a standard process flow (step 512).

Figure 6:
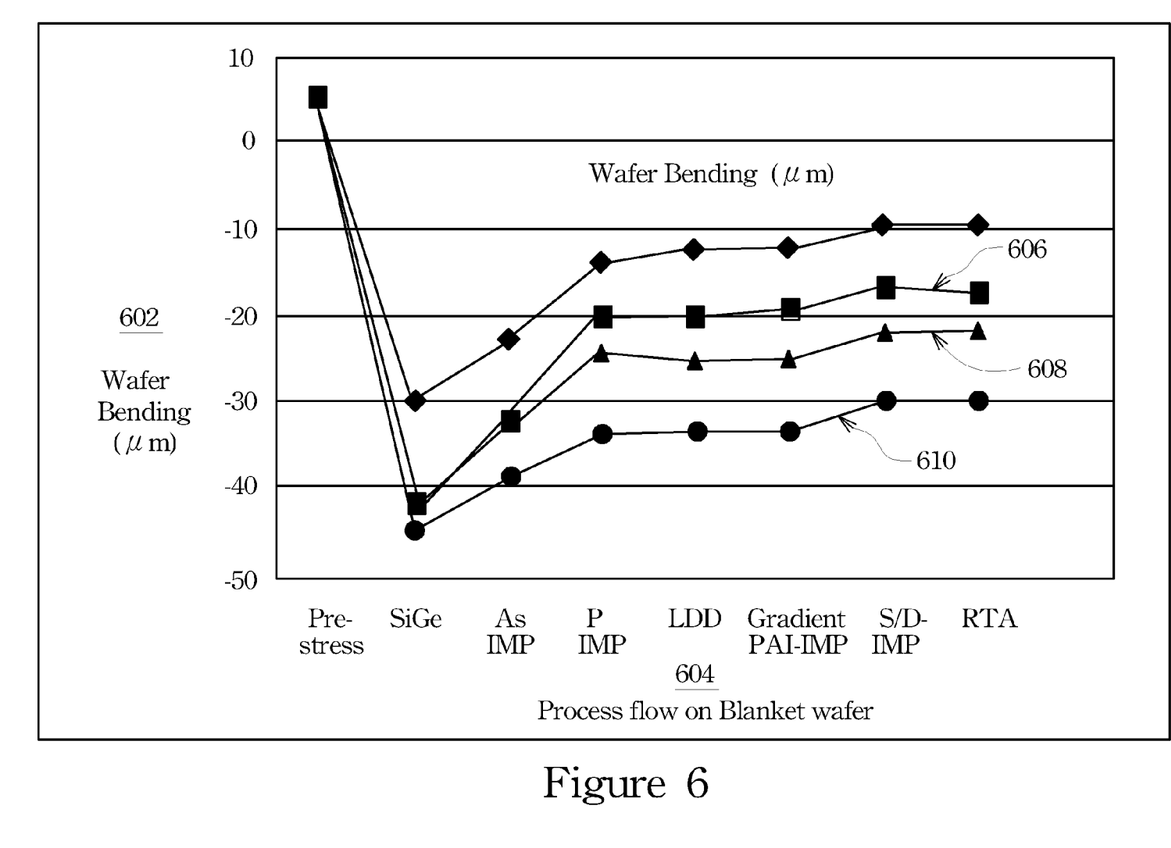
FIG. 6 is a graph illustrating stress relaxation for standard wafers and of a bi-layer wafer embodiment.

Advantages of illustrative embodiments include providing a method and structure wherein the techniques for a source/drain region structure on a semiconductor device may be optimized for providing a higher strain to Si channel and a higher strain retention of the structure. FIG. 6 shows a graph of the effects of blanket processing on test wafers, wafer bending (μm) 602 versus cumulative process step 604. Curve 606 is a SiGe process with no cap layer. Curve 608 is a graded SiGe process with no cap layer. Curve 610 is a SiGe process with a Si cap layer. Note that curve 610 shows less relaxation of the strained layer as the wafer is processed.

Figure 7:
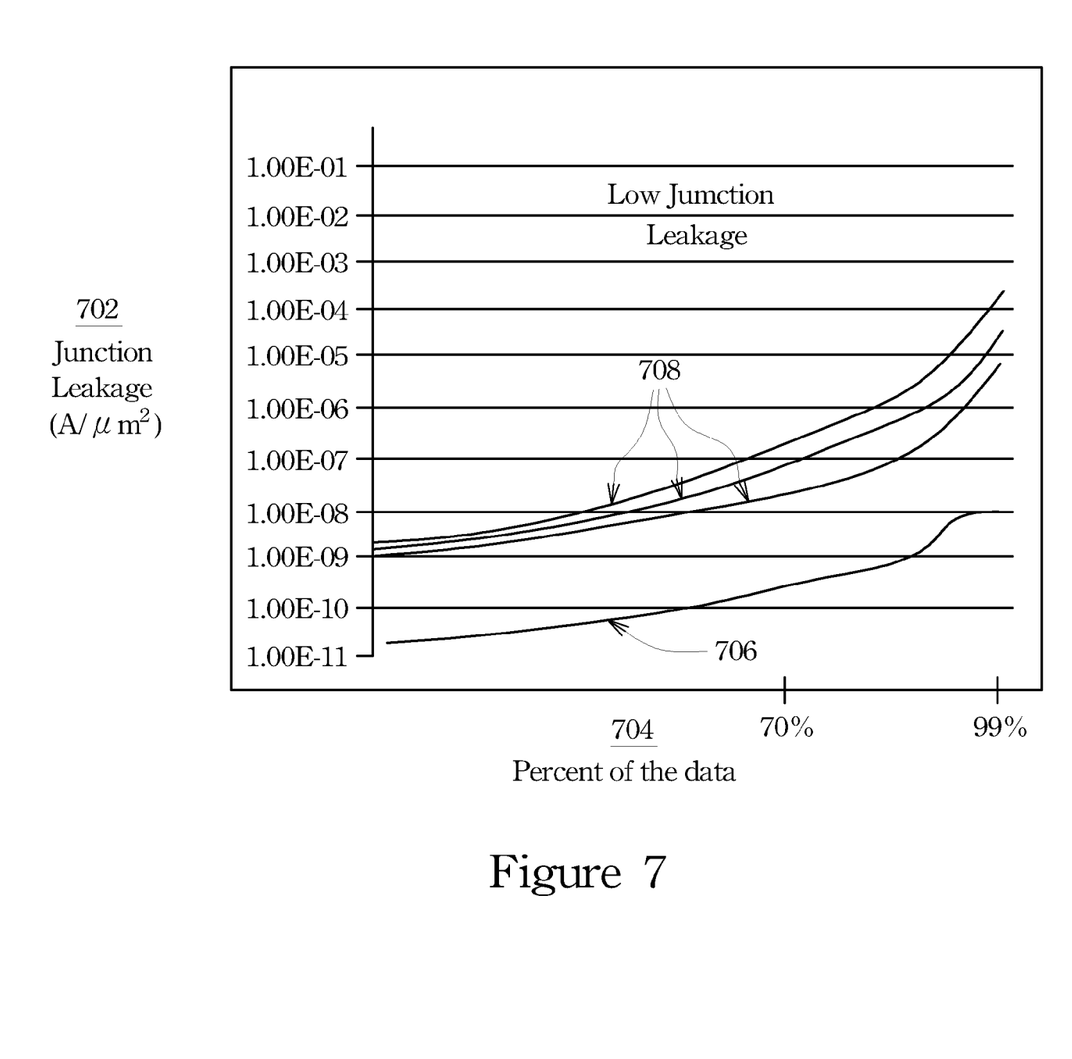
FIG. 7 is a graph illustrating junction leakage for a standard structure and of a bi-layer embodiment structure.

Further, the improved source/drain regions may provide a higher device gain, a lower sheet resistivity, and a lower junction leakage. FIG. 7 is a graph illustrating an improvement in junction leakage for a P+NW. The graph shows junction leakage 702 by percent of the data points for test structures on experimental wafers 704. Curve 706 is the representative data for an embodiment of a bi-layer SiC source/drain structure capped with a SiP layer. Curves 708 are representative of data for a standard structure. Note the marked reduction in junction leakage. The average junction leakage dropped between 1 and 2 orders of magnitude comparing the data from the bi-layer process to the data from the standard process.

Figure 8:
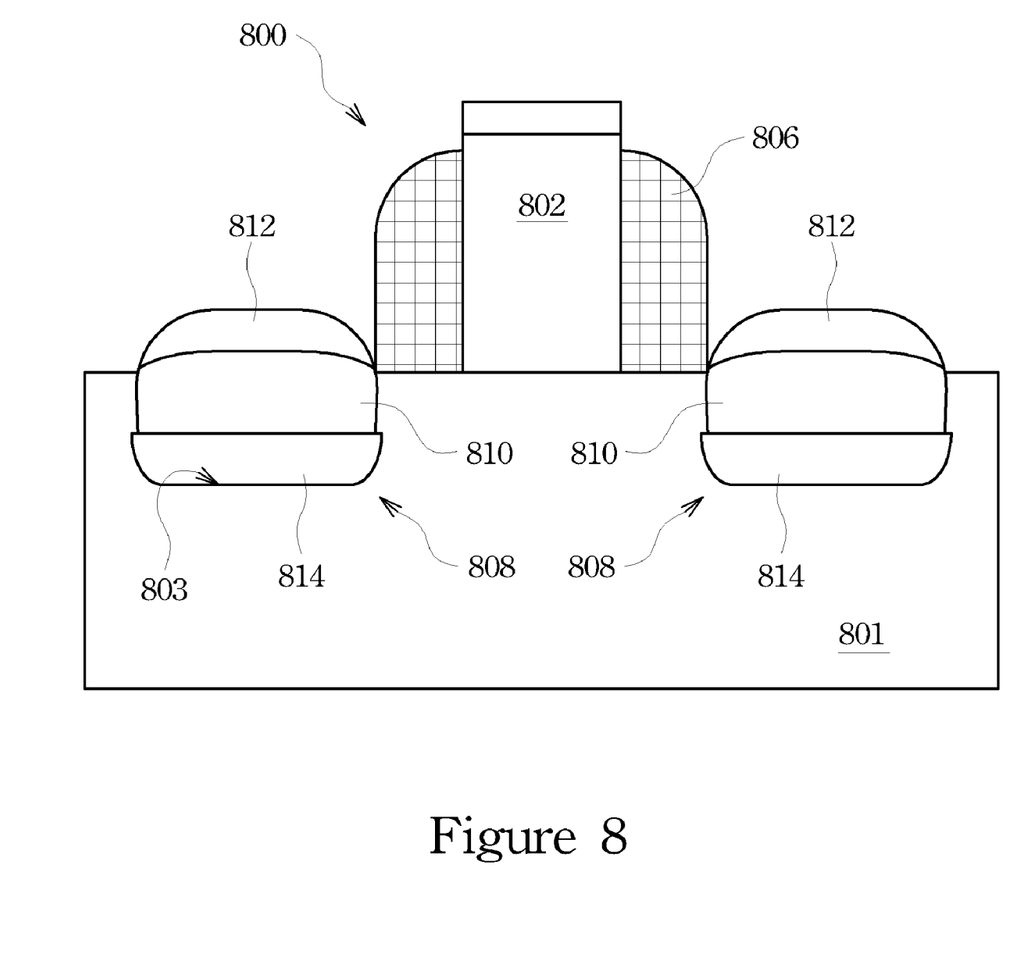
FIG. 8 is a cross-sectional view of a further illustrative embodiment of a tri-layer source/drain structure.

FIG. 8 is a cross-sectional view of an illustrative embodiment, showing a non-shared source/drain region. Work piece 800 has included substrate 801, gate electrode 802 and sidewall spacer 806. The source drain region 808 is comprised of main strained layer 810 disposed in an etched opening in substrate 801. Main strained layer 810 may be $Si_xGe_y$ (SiGe) or $Si_xC_y$ (SiC) for example. Further, main strained layer 810 may be moderately doped with N-type dopant for N-channel devices such as phosphorous, and P-type dopant for P-channel devices such as boron. The moderate dopant levels may be, for example, between 1 E19 $cm^{-3}$-1 E20 $cm^{-3}$. The main strained layer 810 may consist of SiGe in the case of a PMOS transistor or silicon carbide (SiC) in the case of an NMOS transistor. A first strained layer 814 is interposed between the surface of the etched substrate 803 and main strained layer 810 of source/drain region 808. First strained layer 814 may be a lightly doped layer of the same material as main strained layer 810. Lightly doped, in this context, means less than 1 E19 $cm^{-3}$ of N-type dopant or P-type dopant. Main strained layer 810 is adjacent to first strained layer 814. Capping layer 812 is adjacent to main strained layer 810. While FIG. 8 illustrates the tri-layer embodiment, the non-shared source/drain structure may also be of bi-layer construction.

Capping layer 812 may be a Si layer, a SiB layer, a combination of layers or the like for a PMOS transistor. Capping layer 812 may be a Si layer, a SiP, a combination of the layers, or the like for an NMOS transistor.

Although the illustrative embodiments and their advantages have been described in detail, it should be understood that various changes, substitutions, and alterations can be made herein without departing from the spirit and scope of the invention as defined by the appended claims. As another example, it will be readily understood by those skilled in the art that specific thicknesses may be varied by technology while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a substrate;
    a trench within a source/drain region of the substrate, the trench comprising a first sidewall adjoining a gate structure on the substrate, and comprising a second sidewall disposed opposite from the first sidewall;
    a lightly doped sub-layer disposed in the trench extending from the first sidewall to adjoining the second sidewall;
    a strained layer disposed in the trench and over the lightly doped sub-layer, wherein the strained layer comprises SiGe; and
    a capping layer in contact with the strained layer, wherein the capping layer is selected from a group consisting of Si, SiB, and a combination of Si and SiB.

2. The semiconductor device of claim 1, wherein a depth of the trench is in a range of about 30-100 nm.

3. The semiconductor device of claim 1, wherein the strained layer has a moderate dopant concentration.

4. The semiconductor device of claim 3, wherein the moderate dopant concentration is between 1 E19 cm$^{-3}$ and 1 E20 cm$^{-3}$.

5. The semiconductor device of claim 1, wherein the lightly doped sub-layer is a boron doped SiGe.

6. The semiconductor device of claim 1, wherein a dopant concentration of the lightly doped sub-layer is less than 1 E19 cm$^{-3}$.

7. A semiconductor device comprising:
a substrate;
a trench within a source/drain region of the substrate, the trench comprising a first sidewall aligned with a gate structure on the substrate, and comprising a second sidewall disposed opposite from the first sidewall;
a lightly doped sub-layer disposed in the trench continuing from the first sidewall to adjacent the second sidewall;
a strained layer disposed in the trench and over the lightly doped sub-layer, wherein the strained layer comprises SiC; and
a capping layer in contact with the strained layer, wherein the capping layer is selected from a group consisting of Si, SiP, and a combination of Si and SiP.

8. The semiconductor device of claim 7, wherein a depth of the trench is in the range of about 30 nm and 100 nm.

9. The semiconductor device of claim 7, wherein the strained layer has a moderate dopant concentration.

10. The semiconductor device of claim 9, wherein the moderate dopant concentration is between 1 E19 cm$^{-3}$ and 1 E20 cm$^{-3}$.

11. The semiconductor device of claim 7, wherein the lightly doped sub-layer is a phosphorus doped SiC.

12. The semiconductor device of claim 7, wherein a dopant concentration of the lightly doped sub-layer is less than 1 E19 cm$^{-3}$.

* * * * *